US009082551B2

(12) United States Patent
Osada et al.

(10) Patent No.: US 9,082,551 B2
(45) Date of Patent: Jul. 14, 2015

(54) HIGH DIELECTRIC NANOSHEET LAMINATE, HIGH DIELECTRIC ELEMENT AND METHOD FOR PRODUCING THE SAME

(75) Inventors: Minoru Osada, Ibaraki (JP); Yasuo Ebina, Ibaraki (JP); Takayoshi Sasaki, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 14/118,354

(22) PCT Filed: May 18, 2012

(86) PCT No.: PCT/JP2012/062765
§ 371 (c)(1),
(2), (4) Date: Jan. 14, 2014

(87) PCT Pub. No.: WO2012/157740
PCT Pub. Date: Nov. 22, 2012

(65) Prior Publication Data
US 2014/0150966 A1    Jun. 5, 2014

(30) Foreign Application Priority Data

May 19, 2011   (JP) .................................. 2011-112462

(51) Int. Cl.
*H01G 4/10* (2006.01)
*H01L 49/02* (2006.01)
(Continued)

(52) U.S. Cl.
CPC *H01G 4/10* (2013.01); *B32B 18/00* (2013.01); *B82Y 30/00* (2013.01); *C01G 33/006* (2013.01); *C04B 35/495* (2013.01); *C04B 35/62685* (2013.01); *H01L 21/02197* (2013.01); *H01L 21/02285* (2013.01); *H01L 28/56* (2013.01); *C01P 2002/34* (2013.01); *C01P 2004/24* (2013.01); *C04B 2235/3201* (2013.01); *C04B 2235/3208* (2013.01); *C04B 2235/768* (2013.01); *C04B 2237/34* (2013.01); (Continued)

(58) Field of Classification Search
None
See application file for complete search history.

(56) References Cited

U.S. PATENT DOCUMENTS

2010/0226067 A1   9/2010   Osada et al.
2011/0147060 A1*  6/2011   Osada et al. .................. 174/258

FOREIGN PATENT DOCUMENTS

JP   2001-270022   10/2001
JP   2004-255684    9/2004
(Continued)

OTHER PUBLICATIONS

International Search Report issued Aug. 14, 2012 in International (PCT) Application No. PCT/JP2012/062765.
(Continued)

*Primary Examiner* — David Sample
(74) *Attorney, Agent, or Firm* — Wenderoth, Lind & Ponack, L.L.P.

(57) ABSTRACT

A high dielectric nanosheet laminate is produced by laminating nanosheets, each of which has a thickness of 10 nm or less and is formed of an oxide that has a perovskite structure wherein at least four $NbO_6$ octahedrons, $TaO_6$ octahedrons or $TiO_6$ octahedrons are included in a unit lattice. Consequently, the high dielectric nanosheet laminate is capable of achieving a high dielectric constant and a satisfactory insulation property, which are preferable for high dielectric nanosheet multilayer capacitors or the like, at the same time even if formed very thin.

13 Claims, 2 Drawing Sheets

(51) Int. Cl.
  *B82Y 30/00* (2011.01)
  *H01L 21/02* (2006.01)
  *B32B 18/00* (2006.01)
  *C04B 35/495* (2006.01)
  *C04B 35/626* (2006.01)
  *C01G 33/00* (2006.01)
  *H01L 21/8234* (2006.01)
  *H01L 27/08* (2006.01)

(52) U.S. Cl.
  CPC .... *C04B 2237/345* (2013.01); *C04B 2237/704* (2013.01); *H01L 21/823462* (2013.01); *H01L 27/0805* (2013.01); *Y10T 156/10* (2015.01)

(56) References Cited

FOREIGN PATENT DOCUMENTS

| JP | 2011181725 A | * | 9/2011 |
|---|---|---|---|
| JP | 2011243824 A | * | 12/2011 |
| WO | 2008/078652 | | 7/2008 |

OTHER PUBLICATIONS

Li Baowen et al., "Layer-by-Layer Deposition of Perovskite-Type Nanosheets into Ultrathin Multilayer Films and Their Electrical Properties", 89th Annual Meeting of the Chemical Society of Japan in Spring—Koen Yokoshu I, Mar. 13, 2009, p. 734.

Akatsuka et al., "Construction of Highly Ordered Lamellar Nanostructures through Langmuir—Blodgett Deposition of Molecularly Thin Titania Nanosheets Tens of Micrometers Wide and Their Excellent Dielectric Properties", ACS Nano, vol. 3, No. 5, 2009, pp. 1097-1106.

* cited by examiner

HIGH DIELECTRIC NANOSHEET LAMINATE, HIGH DIELECTRIC ELEMENT AND METHOD FOR PRODUCING THE SAME

TECHNICAL FIELD

The present invention relates to a high dielectric nanosheet laminate that functions as a capacitor preferable by being applied to wide fields of electronic information apparatus such as portable phones and mobile electronic apparatus, as well as to a high dielectric element using this high dielectric nanosheet laminate and a method for producing the same.

BACKGROUND ART

In order to realize a ubiquitous information network society, allowing the electronic apparatus to have multiple functions, a reduced scale, a high frequency, and a low price are keys. As a technology that meets these demands, a technology of high-density mounting onto a printed substrate is currently attracting people's attention. For example, in portable terminal apparatus, multiple functions such as a digital camera, a one-segment television set, a wireless LAN, infrared communication, and GPS are beginning to be mounted and, as a result thereof, the circuit substrate tends to have a larger scale. In order to achieve scale reduction, it is demanded that the number of various high-frequency components such as ceramic chip capacitors mounted on a substrate surface is reduced and the components are integrated.

A circuit substrate that is currently prevalent is made of an epoxy-based resin material provided at a low price. Allowing the electronic apparatus to have multiple functions, a reduced scale, a high frequency, and a low price can be achieved if a ceramic capacitor having a high dielectric constant can be embedded into a printed substrate mainly containing an epoxy-based resin.

Among many dielectric materials, perovskite-based oxide ceramics such as $BaTiO_3$, $(Ba, Sr)TiO_3$, and $Pb(Zr, Ti)O_3$ have excellent dielectric property (a relative dielectric constant of 200 or more), and studies for applying them to electronic devices such as multilayer capacitors and printed substrates have been carried out from the beginning of 1990s. However, the heat-resistance temperature of an epoxy-based resin substrate is about 300° C., and it has been basically impossible to embed a capacitor using perovskite-based oxide ceramics that need a high temperature of 600° C. or higher in forming.

As one method for evading this problem, there is proposed a method of using a composite material in which ceramic nanoparticles such as $BaTiO_3$ are dispersed in a resin. However, in this case, the dielectric constant of the composite material is as low as about several ten because of the low dielectric constant (10 or less) of the resin, making it difficult to meet the demanded performance corresponding to a high frequency.

In the meantime, there is proposed a technology of producing the substrate itself with ceramics. However, because the temperature needed for forming the substrate is as high as about 1000° C., the process is complex and it has been difficult to lower the costs. Also, because the volume shrinks by about 10% or more during the process, the dimension precision cannot be raised, thereby raising a problem in that the demand for miniaturization cannot be met.

Studies are also eagerly carried out that aim at developing a thin-film capacitor having a large capacitance by producing barium titanate-based thin film ($BaTiO_3$, $(Ba, Sr)TiO_3$ or the like) through a thin-film process such as physical vapor deposition or chemical vapor deposition. However, there is a problem in that, when the film thickness of the barium titanate-based thin film is reduced to a 100 nm level, the dielectric constant lowers, so that a film thickness of about 100 nm has been a limit by which the capacitor can operate stably as an element. In order to develop a large-capacitance capacitor element of next generation, there is a need to develop a novel high dielectric material that realizes a high dielectric constant and a satisfactory insulation property at the same time in a nano-region that enable simultaneous realization of further scale reduction and capacitance enlargement of the elements.

CITATION LIST

Patent Literature

Patent Literature 1: Japanese Patent Application Laid-open (JP-A) No. 2001-270022
Patent Literature 2: Japanese Patent Application Laid-open (JP-A) No. 2004-255684

Non-Patent Literature

Non-Patent literature 1: Kosho Akatsuka, Masa-aki Haga, Yasuo Ebina, Minoru Osada, Katsutoshi Fukuda, Takayoshi Sasaki, "Construction of Highly Ordered Lamellar Nanostructures through Langmuir-Blodgett Deposition of Molecularly Thin Titania Nanosheets Tens of Micrometers Wide and Their Excellent Dielectric Properties", ACS Nano, 3, 1097-1106 (2009).

SUMMARY OF INVENTION

Problems to be Solved by the Invention

An object of the present invention is to provide a high dielectric nanosheet laminate that sweeps out such problems as well as a high dielectric element using this high dielectric nanosheet laminate and a method for producing the same.

Means for Solving the Problems

According to one aspect of the present invention, there is provided a high dielectric nanosheet laminate produced by laminating nanosheets each of which has a thickness of 10 nm or less and is formed of an oxide that has a perovskite structure wherein at least four $NbO_6$ octahedrons, $TaO_6$ octahedrons or $TiO_6$ octahedrons are included in a unit lattice.

Here, each of the nanosheets may have a lateral size of 10 nm to 1000 μm.

Also, the nanosheets may be produced by exfoliating any of the layered oxides represented by the following compositional formula or a hydrate thereof:

formula $A[Ca_2Na_{n-3}Nb_nO_{3n+1-d}]$, $A[(Ca_{1-x}Sr_x)_2Na_{n-3}Nb_nO_{3n+1-d}]$, or $A[M_{n-1}A'_{n-3}M'_nO_{3n+1-d}]$ (A, A' are at least one selected from H, Li, Na, K, Rb and Cs; M is at least one selected from Sr, Ba, Pb, Bi, or rare earth elements La, Ce, Pr, Sm, Eu, Gd, Tb, Dy, Ho, Er, Tm, Yb and Lu; M' is at least one selected from Ti, Mg, Mn, Zn, Nb and Ta; x=0 to 1; n=3 to 8; and d=0 to 2).

Also, the nanosheets may be a perovskite oxide represented by the following compositional formula:

formula $[Ca_2Na_{n-3}Nb_nO_{3n+1-d}]$, $[(Ca_{1-x}Sr_x)_2Na_{n-3}Nb_nO_{3n+1-d}]$, or $[M_{n-1}A'_{n-3}M'_nO_{3n+1-d}]$ (A' is at least one selected from H, Li, Na, K, Rb and Cs; M is at least one selected from Sr, Ba, Pb, Bi, or rare earth elements La, Ce, Pr, Sm, Eu, Gd, Tb, Dy, Ho, Er, Tm, Yb and Lu; M' is at least one selected from Ti, Mg, Mn, Zn, Nb and Ta; x=0 to 1; n=3 to 8; and d=0 to 2).

Also, the high dielectric nanosheet laminate may have a thickness of 1 nm to 100 nm.

According to another aspect of the present invention, there is provided a high dielectric element produced by adhering a high dielectric nanosheet laminate according to any of the above onto an electrode substrate.

According to still another aspect of the present invention, there is provided a high dielectric element wherein a high dielectric nanosheet laminate according to any one of the above is disposed between a first electrode substrate and a second electrode substrate.

According to still another aspect of the present invention, there is provided a method for producing the high dielectric element, wherein a high dielectric nanosheet laminate according to any one of the above is adhered onto at least one electrode substrate of the first and second electrode substrates, and the first and second electrode substrates are so disposed that the high dielectric nanosheet laminate is located therebetween.

According to still another aspect of the present invention, there is provided a method for producing the high dielectric element in which the high dielectric nanosheet laminate is produced by repeating a step of forming a monolayer film in which a surface of a substrate is covered with the oxide closely and with no gap by the Langmuir-Blodgett process, and then adhering the monolayer film onto the electrode substrate.

According to still another aspect of the present invention, there is provided a method for producing the high dielectric element in which the high dielectric nanosheet laminate is produced by dipping the electrode substrate into a cationic organic polymer solution to allow an organic polymer to be adsorbed onto a substrate surface thereof, and then dipping the electrode substrate into a colloid solution in which the nanosheets are suspended, so as to allow the nanosheets to be adsorbed onto the polymer by electrostatic interaction.

Here, the overlapping parts of the nanosheets may be removed by applying ultrasonic waves thereto in the step of allowing the nanosheets to be adsorbed onto the electrode substrate by electrostatic interaction.

Also, the organic polymer may be removed through irradiation with UV rays after the high dielectric nanosheet laminate is produced.

Also, the organic polymer may be removed by heating after the high dielectric nanosheet laminate is produced.

Advantage of the Invention

The present invention can provide a nanosheet laminate that is extremely thin and has a high dielectric property (hereafter also referred to as high dielectric thin film) that makes good use of inherent high dielectric property and high structure controllability owned by an oxide having a perovskite structure, as well as products to which the nanosheet laminate has been applied.

BEST MODE FOR CARRYING OUT THE INVENTION

The present inventors and others have found out the high dielectric properties owned by an oxide having a perovskite structure and also have found out a room temperature solution process preferable for fabrication of a high dielectric thin film, thereby arriving at the present invention by further applying these findings.

The present invention has the characteristics described above. Hereafter, embodiments thereof will be described.

Figure 1:
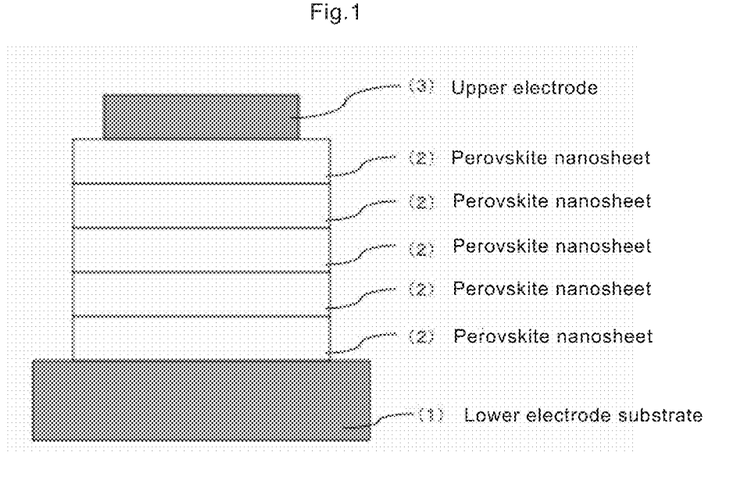
FIG. 1 is a structural model view of a thin film element formed of the perovskite nanosheet thin film shown in each of Examples 1 to 4.

FIG. 1 is a view schematically exemplifying a cross-section structure of a high dielectric thin film made of a perovskite oxide having a high dielectric nanosheet form according to one embodiment of the present invention. In FIG. 1, the reference numeral (1) means a lower electrode substrate made of an atomic planar epitaxial $SrRuO_3$ (which may be hereafter simply referred to as "substrate (1)"), the reference numeral (2) means a high dielectric thin film structure made of a perovskite oxide having a high dielectric nanosheet form (hereafter referred to as perovskite nanosheet) formed on the substrate (1), and the reference numeral (3) means an upper electrode made of gold. Further, this embodiment of FIG. 1 shows an example in which a multilayer structure produced by laminating the perovskite nanosheet (2) on the lower electrode substrate (1) made of $SrRuO_3$ is formed.

Here, in the present invention, the lower electrode substrate (1) is not limited, for example, to an atomic planar epitaxial substrate. The perovskite nanosheet thin film may be similarly disposed on various other kinds of substrates such as a metal electrode of gold, platinum, copper, aluminum or the like, a conductive perovskite substrate of Nb-doped $SrTiO_3$ or the like, a transparent oxide electrode of ITO, Ga-doped ZnO, Nb-doped $TiO_2$ or the like, Si, glass, plastic or the like. Like the lower electrode substrate (1), the upper electrode (3) may be various ones.

The perovskite nanosheet (2) (for example, $Ca_2NaNb_3O_{13}$) constituting a layer of the high dielectric thin film is a nano-substance having a two-dimensional anisotropy obtained by soft chemical treatment of a layered perovskite oxide to exfoliate it into every minimum layer unit of the crystal structure.

The high dielectric element of the present invention is constituted mainly of such a high dielectric perovskite nanosheet or a lamination thereof. Here, for example, the perovskite nanosheet may suitably have a particle size with a thickness of 10 nm or less (corresponding to several atoms) and a lateral size of 100 nm to 1000 μm.

Such a perovskite nanosheet is obtained by exfoliating a layered perovskite oxide. The layered perovskite oxide in this process may be various ones. Suitably, however, the layered perovskite oxide may be, for example, one represented by a compositional formula shown in the following Tables 1 to 4 in which a $NbO_6$ octahedron, a $TaO_6$ octahedron or a $TiO_6$ octahedron, which are a dielectric block having a high function, is included.

TABLE 1

$HCa_2NaNb_4O_{13-d}$, $HCa_2Na_2Nb_5O_{16-d}$, $HCa_2Na_3Nb_6O_{19-d}$,
$HCa_2Na_4Nb_7O_{22-d}$, $HCa_2Na_5Nb_8O_{25-d}$, $HSr_2NaNb_4O_{13-d}$,
$HSr_2Na_2Nb_5O_{16-d}$, $HSr_2Na_3Nb_6O_{19-d}$, $HSr_2Na_4Nb_7O_{22-d}$,
$HSr_2Na_5Nb_8O_{25-d}$, $HBa_2NaNb_4O_{13-d}$, $HBa_2Na_2Nb_5O_{16-d}$,
$HBa_2Na_3Nb_6O_{19-d}$, $HBa_2Na_4Nb_7O_{22-d}$, $HBa_2Na_5Nb_8O_{25-d}$,
$HPb_2NaNb_4O_{13-d}$, $HPb_2Na_2Nb_5O_{16-d}$, $HPb_2Na_3Nb_6O_{19-d}$,
$HPb_2Na_4Nb_7O_{22-d}$, $HPb_2Na_5Nb_8O_{25-d}$, $H(Ca_{1-x}Sr_x)_2NaNb_4O_{13-d}$,
$H(Ca_{1-x}Sr_x)_2Na_2Nb_5O_{16-d}$, $H(Ca_{1-x}Sr_x)_2Na_3Nb_6O_{19-d}$,
$H(Ca_{1-x}Sr_x)_2Na_4Nb_7O_{22-d}$, $H(Ca_{1-x}Sr_x)_2Na_5Nb_8O_{25-d}$,
$HCa_2Na(Nb_{1-x}Ta_x)_4O_{13-d}$, $HCa_2Na_2(Nb_{1-x}Ta_x)_5O_{16-d}$,
$HCa_2Na_3(Nb_{1-x}Ta_x)_6O_{19-d}$, $HCa_2Na_4(Nb_{1-x}Ta_x)_7O_{22-d}$,
$HCa_2Na_5(Nb_{1-x}Ta_x)_8O_{25-d}$, $HSr_2Na(Nb_{1-x}Ta_x)_4O_{13-d}$,
$HSr_2Na_2(Nb_{1-x}Ta_x)_5O_{16-d}$, $HSr_2Na_3(Nb_{1-x}Ta_x)_6O_{19-d}$,
$HSr_2Na_4(Nb_{1-x}Ta_x)_7O_{22-d}$, $HSr_2Na_5(Nb_{1-x}Ta_x)_8O_{25-d}$,
$LiCa_2NaNb_4O_{13-d}$, $LiCa_2Na_2Nb_5O_{16-d}$, $LiCa_2Na_3Nb_6O_{19-d}$,
$LiCa_2Na_4Nb_7O_{22-d}$, $LiCa_2Na_5Nb_8O_{25-d}$, $LiSr_2NaNb_4O_{13-d}$,
$LiSr_2Na_2Nb_5O_{16-d}$, $LiSr_2Na_3Nb_6O_{19-d}$, $LiSr_2Na_4Nb_7O_{22-d}$,
$LiSr_2Na_5Nb_8O_{25-d}$, $LiBa_2NaNb_4O_{13-d}$, $LiBa_2Na_2Nb_5O_{16-d}$,
$LiBa_2Na_3Nb_6O_{19-d}$, $LiBa_2Na_4Nb_7O_{22-d}$, $LiBa_2Na_5Nb_8O_{25-d}$,
$LiPb_2NaNb_4O_{13-d}$, $LiPb_2Na_2Nb_5O_{16-d}$, $LiPb_2Na_3Nb_6O_{19-d}$,
$LiPb_2Na_4Nb_7O_{22-d}$, $LiPb_2Na_5Nb_8O_{25-d}$, $Li(Ca_{1-x}Sr_x)_2NaNb_4O_{13-d}$,
$Li(Ca_{1-x}Sr_x)_2Na_2Nb_5O_{16-d}$, $Li(Ca_{1-x}Sr_x)_2Na_3Nb_6O_{19-d}$,
$Li(Ca_{1-x}Sr_x)_2Na_4Nb_7O_{22-d}$, $Li(Ca_{1-x}Sr_x)_2Na_5Nb_8O_{25-d}$,
$LiCa_2Na(Nb_{1-x}Ta_x)_4O_{13-d}$, $LiCa_2Na_2(Nb_{1-x}Ta_x)_5O_{16-d}$
$LiCa_2Na_3(Nb_{1-x}Ta_x)_6O_{19-d}$, $LiCa_2Na_4(Nb_{1-x}Ta_x)_7O_{22-d}$,
$LiCa_2Na_5(Nb_{1-x}Ta_x)_8O_{25-d}$, $LiSr_2Na(Nb_{1-x}Ta_x)_4O_{13-d}$,
$LiSr_2Na_2(Nb_{1-x}Ta_x)_5O_{16-d}$, $LiSr_2Na_3(Nb_{1-x}Ta_x)_6O_{19-d}$,
$LiSr_2Na_4(Nb_{1-x}Ta_x)_7O_{22-d}$, $LiSr_2Na_5(Nb_{1-x}Ta_x)_8O_{25-d}$,
$NaCa_2NaNb_4O_{13-d}$, $NaCa_2Na_2Nb_5O_{16-d}$, $NaCa_2Na_3Nb_6O_{19-d}$,
$NaCa_2Na_4Nb_7O_{22-d}$,

TABLE 2

$NaCa_2Na_5Nb_8O_{25-d}$, $NaSr_2NaNb_4O_{13-d}$, $NaSr_2Na_2Nb_5O_{16-d}$,
$NaSr_2Na_3Nb_6O_{19-d}$, $NaSr_2Na_4Nb_7O_{22-d}$, $NaSr_2Na_5Nb_8O_{25-d}$,
$NaBa_2NaNb_4O_{13-d}$, $NaBa_2Na_2Nb_5O_{16-d}$, $NaBa_2Na_3Nb_6O_{19-d}$,
$NaBa_2Na_4Nb_7O_{22-d}$, $NaBa_2Na_5Nb_8O_{25-d}$, $NaPb_2NaNb_4O_{13-d}$,
$NaPb_2Na_2Nb_5O_{16-d}$, $NaPb_2Na_3Nb_6O_{19-d}$, $NaPb_2Na_4Nb_7O_{22-d}$,
$NaPb_2Na_5Nb_8O_{25-d}$, $Na(Ca_{1-x}Sr_x)_2NaNb_4O_{13-d}$,
$Na(Ca_{1-x}Sr_x)_2Na_2Nb_5O_{16-d}$, $Na(Ca_{1-x}Sr_x)_2Na_3Nb_6O_{19-d}$,
$Na(Ca_{1-x}Sr_x)_2Na_4Nb_7O_{22-d}$, $Na(Ca_{1-x}Sr_x)_2Na_5Nb_8O_{25-d}$,
$NaCa_2Na(Nb_{1-x}Ta_x)_4O_{13-d}$, $NaCa_2Na_2(Nb_{1-x}Ta_x)_5O_{16-d}$,
$NaCa_2Na_3(Nb_{1-x}Ta_x)_6O_{19-d}$, $NaCa_2Na_4(Nb_{1-x}Ta_x)_7O_{22-d}$,
$NaCa_2Na_5(Nb_{1-x}Ta_x)_8O_{25-d}$, $NaSr_2Na(Nb_{1-x}Ta_x)_4O_{13-d}$,
$NaSr_2Na_2(Nb_{1-x}Ta_x)_5O_{16-d}$, $NaSr_2Na_3(Nb_{1-x}Ta_x)_6O_{19-d}$,
$NaSr_2Na_4(Nb_{1-x}Ta_x)_7O_{22-d}$, $NaSr_2Na_5(Nb_{1-x}Ta_x)_8O_{25-d}$,
$KCa_2NaNb_4O_{13-d}$, $KCa_2Na_2Nb_5O_{16-d}$, $KCa_2Na_3Nb_6O_{19-d}$,
$KCa_2Na_4Nb_7O_{22-d}$, $KCa_2Na_5Nb_8O_{25-d}$, $KSr_2NaNb_4O_{13-d}$,
$KSr_2Na_2Nb_5O_{16-d}$, $KSr_2Na_3Nb_6O_{19-d}$, $KSr_2Na_4Nb_7O_{22-d}$,
$KSr_2Na_5Nb_8O_{25-d}$, $KBa_2NaNb_4O_{13-d}$, $KBa_2Na_2Nb_5O_{16-d}$,
$KBa_2Na_3Nb_6O_{19-d}$, $KBa_2Na_4Nb_7O_{22-d}$, $KBa_2Na_5Nb_8O_{25-d}$,
$KPb_2NaNb_4O_{13-d}$, $KPb_2Na_2Nb_5O_{16-d}$, $KPb_2Na_3Nb_6O_{19-d}$,
$KPb_2Na_4Nb_7O_{22-d}$, $KPb_2Na_5Nb_8O_{25-d}$, $K(Ca_{1-x}Sr_x)_2NaNb_4O_{13-d}$,
$K(Ca_{1-x}Sr_x)_2Na_2Nb_5O_{16-d}$, $K(Ca_{1-x}Sr_x)_2Na_3Nb_6O_{19-d}$,
$K(Ca_{1-x}Sr_x)_2Na_4Nb_7O_{22-d}$, $K(Ca_{1-x}Sr_x)_2Na_5Nb_8O_{25-d}$,
$KCa_2Na(Nb_{1-x}Ta_x)_4O_{13-d}$, $KCa_2Na_2(Nb_{1-x}Ta_x)_5O_{16-d}$,
$KCa_2Na_3(Nb_{1-x}Ta_x)_6O_{19-d}$, $KCa_2Na_4(Nb_{1-x}Ta_x)_7O_{22-d}$,
$KCa_2Na_5(Nb_{1-x}Ta_x)_8O_{25-d}$, $KSr_2Na(Nb_{1-x}Ta_x)_4O_{13-d}$,
$KSr_2Na_2(Nb_{1-x}Ta_x)_5O_{16-d}$, $KSr_2Na_3(Nb_{1-x}Ta_x)_6O_{19-d}$,
$KSr_2Na_4(Nb_{1-x}Ta_x)_7O_{22-d}$, $KSr_2Na_5(Nb_{1-x}Ta_x)_8O_{25-d}$,
$KCa_2NaNb_4O_{13-d}$, $KCa_2Na_2Nb_5O_{16-d}$, $KCa_2Na_3Nb_6O_{19-d}$,
$KCa_2Na_4Nb_7O_{22-d}$, $KCa_2Na_5Nb_8O_{25-d}$, $KSr_2NaNb_4O_{13-d}$,
$KSr_2Na_2Nb_5O_{16-d}$, $KSr_2Na_3Nb_6O_{19-d}$,

TABLE 3

$KSr_2Na_4Nb_7O_{22-d}$, $KSr_2Na_5Nb_8O_{25-d}$, $KBa_2NaNb_4O_{13-d}$,
$KBa_2Na_2Nb_5O_{16-d}$, $KBa_2Na_3Nb_6O_{19-d}$, $KBa_2Na_4Nb_7O_{22-d}$,
$KBa_2Na_5Nb_8O_{25-d}$, $KPb_2NaNb_4O_{13-d}$, $KPb_2Na_2Nb_5O_{16-d}$,
$KPb_2Na_3Nb_6O_{19-d}$, $KPb_2Na_4Nb_7O_{22-d}$, $KPb_2Na_5Nb_8O_{25-d}$,
$K(Ca_{1-x}Sr_x)_2NaNb_4O_{13-d}$, $K(Ca_{1-x}Sr_x)_2Na_2Nb_5O_{16-d}$,
$K(Ca_{1-x}Sr_x)_2Na_3Nb_6O_{19-d}$, $K(Ca_{1-x}Sr_x)_2Na_4Nb_7O_{22-d}$,
$K(Ca_{1-x}Sr_x)_2Na_5Nb_8O_{25-d}$, $KCa_2Na(Nb_{1-x}Ta_x)_4O_{13-d}$,
$KCa_2Na_2(Nb_{1-x}Ta_x)_5O_{16-d}$, $KCa_2Na_3(Nb_{1-x}Ta_x)_6O_{19-d}$,
$KCa_2Na_4(Nb_{1-x}Ta_x)_7O_{22-d}$, $KCa_2Na_5(Nb_{1-x}Ta_x)_8O_{25-d}$,

TABLE 3-continued $KSr_2Na(Nb_{1-x}Ta_x)_4O_{13-d}$, $KSr_2Na_2(Nb_{1-x}Ta_x)_5O_{16-d}$,
$KSr_2Na_3(Nb_{1-x}Ta_x)_6O_{19-d}$, $KSr_2Na_4(Nb_{1-x}Ta_x)_7O_{22-d}$,
$KSr_2Na_5(Nb_{1-x}Ta_x)_8O_{25-d}$, $RbCa_2NaNb_4O_{13-d}$,
$RbCa_2Na_2Nb_5O_{16-d}$, $RbCa_2Na_3Nb_6O_{19-d}$, $RbCa_2Na_4Nb_7O_{22-d}$,
$RbCa_2Na_5Nb_8O_{25-d}$, $RbSr_2NaNb_4O_{13-d}$, $RbSr_2Na_2Nb_5O_{16-d}$,
$RbSr_2Na_3Nb_6O_{19-d}$, $RbSr_2Na_4Nb_7O_{22-d}$, $RbSr_2Na_5Nb_8O_{25-d}$,
$RbBa_2NaNb_4O_{13-d}$, $RbBa_2Na_2Nb_5O_{16-d}$, $RbBa_2Na_3Nb_6O_{19-d}$,
$RbBa_2Na_4Nb_7O_{22-d}$, $RbBa_2Na_5Nb_8O_{25-d}$, $RbPb_2NaNb_4O_{13-d}$,
$RbPb_2Na_2Nb_5O_{16-d}$, $RbPb_2Na_3Nb_6O_{19-d}$, $RbPb_2Na_4Nb_7O_{22-d}$,
$RbPb_2Na_5Nb_8O_{25-d}$, $Rb(Ca_{1-x}Sr_x)_2NaNb_4O_{13-d}$,
$Rb(Ca_{1-x}Sr_x)_2Na_2Nb_5O_{16-d}$, $Rb(Ca_{1-x}Sr_x)_2Na_3Nb_6O_{19-d}$,
$Rb(Ca_{1-x}Sr_x)_2Na_4Nb_7O_{22-d}$, $Rb(Ca_{1-x}Sr_x)_2Na_5Nb_8O_{25-d}$,
$RbCa_2Na(Nb_{1-x}Ta_x)_4O_{13-d}$, $RbCa_2Na_2(Nb_{1-x}Ta_x)_5O_{16-d}$,
$RbCa_2Na_3(Nb_{1-x}Ta_x)_6O_{19-d}$, $RbCa_2Na_4(Nb_{1-x}Ta_x)_7O_{22-d}$,
$RbCa_2Na_5(Nb_{1-x}Ta_x)_8O_{25-d}$, $RbSr_2Na(Nb_{1-x}Ta_x)_4O_{13-d}$,
$RbSr_2Na_2(Nb_{1-x}Ta_x)_5O_{16-d}$, $RbSr_2Na_3(Nb_{1-x}Ta_x)_6O_{19-d}$,
$RbSr_2Na_4(Nb_{1-x}Ta_x)_7O_{22-d}$, $RbSr_2Na_5(Nb_{1-x}Ta_x)_8O_{25-d}$,
$CsCa_2NaNb_4O_{13-d}$, $CsCa_2Na_2Nb_5O_{16-d}$, $CsCa_2Na_3Nb_6O_{19-d}$,
$CsCa_2Na_4Nb_7O_{22-d}$, $CsCa_2Na_5Nb_8O_{25-d}$, $CsSr_2NaNb_4O_{13-d}$,
$CsSr_2Na_2Nb_5O_{16-d}$, $CsSr_2Na_3Nb_6O_{19-d}$, $CsSr_2Na_4Nb_7O_{22-d}$,
$CsSr_2Na_5Nb_8O_{25-d}$, $CsBa_2NaNb_4O_{13-d}$, $CsBa_2Na_2Nb_5O_{16-d}$,

TABLE 4

$CsBa_2Na_3Nb_6O_{19-d}$, $CsBa_2Na_4Nb_7O_{22-d}$, $CsBa_2Na_5Nb_8O_{25-d}$,
$CsPb_2NaNb_4O_{13-d}$, $CsPb_2Na_2Nb_5O_{16-d}$, $CsPb_2Na_3Nb_6O_{19-d}$,
$CsPb_2Na_4Nb_7O_{22-d}$, $CsPb_2Na_5Nb_8O_{25-d}$, $Cs(Ca_{1-x}Sr_x)_2NaNb_4O_{13-d}$,
$Cs(Ca_{1-x}Sr_x)_2Na_2Nb_5O_{16-d}$, $Cs(Ca_{1-x}Sr_x)_2Na_3Nb_6O_{19-d}$,
$Cs(Ca_{1-x}Sr_x)_2Na_4Nb_7O_{22-d}$, $Cs(Ca_{1-x}Sr_x)_2Na_5Nb_8O_{25-d}$,
$CsCa_2Na(Nb_{1-x}Ta_x)_4O_{13-d}$, $CsCa_2Na_2(Nb_{1-x}Ta_x)_5O_{16-d}$,
$CsCa_2Na_3(Nb_{1-x}Ta_x)_6O_{19-d}$, $CsCa_2Na_4(Nb_{1-x}Ta_x)_7O_{22-d}$,
$CsCa_2Na_5(Nb_{1-x}Ta_x)_8O_{25-d}$, $CsSr_2Na(Nb_{1-x}Ta_x)_4O_{13-d}$,
$CsNaSr_2Na_2(Nb_{1-x}Ta_x)_5O_{16-d}$, $CsSr_2Na_3(Nb_{1-x}Ta_x)_6O_{19-d}$,
$CsSr_2Na_4(Nb_{1-x}Ta_x)_7O_{22-d}$, $CsSr_2Na_5(Nb_{1-x}Ta_x)_8O_{25-d}$
($x = 0-1$; $d = 0-2$).

The treatment for exfoliating can be referred to as a soft chemical treatment, and this soft chemical treatment is a combined treatment of acid treatment and colloidalization treatment. Specifically, a powder or a single crystal of a perovskite oxide having a layered structure is contacted with an aqueous acid solution such as hydrochloric acid, and the product is collected through filtration, washed and dried, whereby the alkali metal ions having existed between the layers before the treatment are all substituted with hydrogen ions to give a hydrogen-type substance. Next, the obtained hydrogen-type substance is put into an aqueous solution of an amine or the like and stirred therein, which is thus colloidalized. In this process, the layers having formed the layered structure are exfoliated into the individual layers. The film thickness can be controlled within a range of nm. The nanosheet exfoliating by soft chemical treatment is a currently well-known technology because the inventors of the present application and others invented this before and filed a patent application or publicized a thesis therefor. Accordingly, the present inventors and others consider that there is no need to give a general description thereof in further more detail than this in the present application; however, if necessary, reference should be made, for example, on patent documents 1 and 2.

Then, the exfoliated perovskite nanosheets can be formed into a high dielectric thin film by using the Langmuir-Blodgett process (which may be hereafter simply referred to as "LB method") that the present inventors and others have already proposed.

The LB method is a technology known as a film formation method for a clay mineral or an organic nano-thin film in which an association membrane is formed on a vapor-water interface with using amphiphilic molecules, and this is transferred onto a substrate to produce a uniform monolayer film. In the case of perovskite nanosheets, when a low-concentration perovskite nanosheet sol solution is used, the nanosheets are adsorbed onto the vapor-water interface without using amphiphilic cationic molecules. Further, by collecting and gathering the nanosheets adsorbed onto the vapor-water interface with use of a barrier, a high-quality monolayer film can be produced in which the surface of the substrate is coated with perovskite nanosheets closely and with no gap.

Further, by repeating the LB method described above to laminate the perovskite nanosheets, a high dielectric thin film having a multilayer structure is provided. For the details of the LB method, reference should be made on non-patent document 1.

Also, besides the LB method described above, a similar high dielectric thin film made of perovskite nanosheets can be formed by the alternate self-organization lamination technology that the present inventors and others have already proposed in patent document 1 and patent document 2.

In an actual process, a series of operations of subjecting the substrate to (1) dipping into an organic polycation solution→(2) washing with pure water→(3) dipping into a perovskite nanosheet sol solution→(4) washing with pure water are regarded as one cycle, and this is repeated for a needed number of times on at least two kinds of perovskite nanosheets. As the organic polycation, preferable are polyethyleneimine (PEI) described in Examples, and also polydiallyldimethylammonium chloride (PDDA), polyallylamine hydrochloride (PAH) and the like having a similar cationic property. Further, in alternate lamination, there is basically no problem if a positive charge can be introduced into the substrate surface and, accordingly, any positive charge-having inorganic polymer and polynuclear hydroxide ion-containing inorganic compound can be usable in place of the organic polymer.

Further, in the present invention, as a method for forming a perovskite nanosheet monolayer constituting a layer of the high dielectric thin film, there is provided a method for forming a monolayer film characterized by covering the surface of the substrate with perovskite nanosheets closely and with no gap, and removing or reducing the mutual overlapping of the perovskite nanosheets.

In this method, there can be exemplified a method for forming a monolayer characterized in that the means for covering the surface of the substrate with perovskite nanosheets and with no gap is by a process of dipping the substrate into a cationic organic polymer solution to allow the organic polymer to be adsorbed onto the surface of the substrate and then dipping the substrate into a colloid solution in which the thin chip particles are suspended, thereby to allow the nanosheets to be adsorbed onto the substrate in a self-organized manner by electrostatic interaction, and a method for forming a monolayer film characterized in that the processing means for removing or reducing the overlapping parts of the perovskite nanosheets is by carrying out an ultrasonic treatment in an alkaline aqueous solution. By this technology, a high-quality monolayer film in which the surface of the substrate is covered with perovskite nanosheets closely and with no gap, which is equivalent to the one produced by the LB method, can be produced.

Further, by repeating the above-described method to laminate the perovskite nanosheets, a high dielectric thin film having a multilayer structure can be provided.

Further, in the above method, an inorganic high dielectric thin film can be formed by removing the organic polymer by UV irradiation. The irradiation with UV rays in this process may be in any mode of irradiation with UV rays containing a wavelength of not more than band gaps at which the optical catalytic organic substance decomposition reaction of layered perovskite oxides is active, and more preferred is irradiation for 12 hours or more with a xenon light source of 1 $mW/cm^2$ or more.

For forming an inorganic high dielectric thin film, a treatment by low-temperature heating can be carried out besides the UV irradiation, and an effect equivalent to that obtained by UV irradiation can be produced. The heating treatment in this process may be carried out at a temperature of 800° C. or lower which is a temperature for thermal stabilization of the layered perovskite oxides, and it is preferable that the heat treatment is carried out at a temperature of 300° C. or lower in the case of a resin substrate such as epoxy or a substrate having a low heat-resistance temperature.

In the present invention, there is realized a method for producing a high dielectric thin film or an element thereof characterized by including the above-described method as at least a part of the steps.

For example, in the embodiments shown by the following Examples, a perovskite nanosheet ($Ca_2NaNb_4O_{13}$, $Ca_2Na_2Nb_5O_{16}$) is produced starting from a layered perovskite oxide ($KCa_2NaNb_4O_{13}$, $KCa_2Na_2Nb_5O_{16}$), and a high dielectric thin film having a multilayer structure is produced on an atomic planar epitaxial $SrRuO_3$ substrate by the LB method or the alternate self-organization lamination technology via a cationic polymer, as shown in FIG. 1.

Needless to say, the present invention should not be limited by the Examples given hereinunder.

EXAMPLES

Example 1

In the present Example, a perovskite nanosheet ($Ca_2NaNb_4O_{13}$) was produced starting from a layered perovskite oxide (for example, $KCa_2NaNb_4O_{13}$) and, as shown in FIG. 1, a high dielectric thin film made of the perovskite nanosheet (2) was produced as shown below on an atomic planar epitaxial $SrRuO_3$ substrate (1) serving as a lower electrode substrate by the LB method.

The layered perovskite oxide $KCa_2NaNb_4O_{13}$ was obtained by mixing $KCa_2Nb_3O_{10}$ and $NaNbO_3$ in a ratio of 1:1 and sintering the obtained mixture at 1273K for 24 hours. Then, 5 g of the obtained powder was acid-treated in 200 cm³ of 5 N nitric acid solution at room temperature to give a hydrogen-exchanged layered perovskite oxide $HCa_2NaNb_4O_{13}\cdot1.5H_2O$, and thereafter 100 cm³ of an aqueous solution of tetrabutylammonium hydroxide (hereinafter referred to as TBAOH) was added to 0.4 g of each of the hydrogen-exchanged layered perovskite oxide, and reacted with stirring at room temperature for 7 days to give a milky white sol solution in which rectangular nanosheets (2) having a compositional formula of $Ca_2NaNb_4O_{13}$ and having a thickness of about 2 nm and a lateral size about 10 μm were dispersed.

The surface of the conductive substrate (1) that would be a lower electrode made of an atomic planar epitaxial $SrRuO_3$ was washed by UV irradiation in an ozone atmosphere.

In a 1-dm³ volumetric flask, 8 cm³ of each of the perovskite nanosheet sol solutions was dispersed in ultra pure water. This dispersion solution was left to stand for about half a day to one day, and then the dispersion solution was spread on an LB trough well washed with acetone, and kept as such for 30 minutes so that the liquid surface would be stabilized and the temperature of the lower layer liquid would reach constant.

Thereafter, the above-prepared substrate (1) was set in an LB film formation apparatus and, with a series of operations shown below being carried out as one cycle on the perovskite nanosheets, this cycle was repeated to laminate the perovskite nanosheets, whereby a high dielectric thin film having a multilayer structure was provided.

[1] The barrier is moved at a compression speed of 0.5 mm/min to compress the surface, whereby one kind of the perovskite nanosheets dispersed on the vapor/water interface are collected and gathered, and after the system has reached a predetermined pressure, this is quietly left to stand for 30 minutes. In that manner, a monolayer film is formed in which the perovskite nanosheets are aligned in parallel and are integrated in the vapor/water interface.

[2] The substrate (1) is vertically drawn up at a drawing speed of 0.8 mm/min to adhere the monolayer film onto the substrate, whereby a thin film is produced in which the one kind of perovskite nanosheets are closely packed.

The thin film thus produced and having a multilayer structure was irradiated with UV rays from a xenon light source (1 mW/cm$^2$, 72 hours) to give a thin film from which the TBAOH used as an exfoliating agent had been decomposed and removed through optical catalytic reaction of the perovskite nanosheets.

Figure 2:
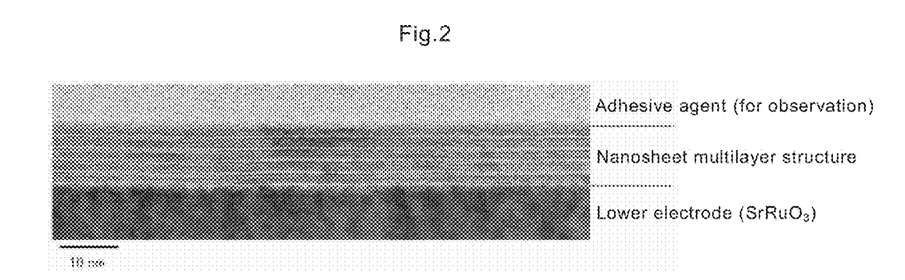
FIG. 2 is a view showing a result of evaluating of the cross-section structure of the thin film by observation with a high-resolution transmission electron microscope on the thin film obtained by laminating five layers of perovskite nanosheets shown in Example 1.

FIG. 2 is a result of evaluating the cross-section structure of the thin film by observation with a high-resolution transmission electronic microscope on the multilayer structure in which five layers of $Ca_2NaNb_4O_{13}$ thus produced are laminated. A multilayer structure in which nanosheets were accumulated in parallel on an atomic level on the substrate was confirmed, and it had a multilayer structure in which five layers each having a thickness of about 2 nm were laminated. By this, it could be confirmed that a high-quality film having a multilayer structure was realized in which the nanosheet monolayer films were alternately laminated while maintaining the closeness and smoothness of the nanosheet monolayer films.

The matter that should be further noted in FIG. 2 is that there was formed neither a low-dielectric layer nor an interface layer accompanying the substrate interface deterioration and the composition deviation caused by thermal annealing in the production sequence, which was problematic in already-existing ferroelectric high-dielectric thin films, between the substrate (1) serving as the lower electrode and the perovskite nanosheet thin film. This is a remarkable effect produced by the fact that the production sequence for the nanosheet thin film of the present Example uses a room-temperature solution process free from the influence of substrate interface deterioration and composition deviation.

Table 5 shows the data of the relative dielectric constant and the leak current density of the thin film elements, that is, the high dielectric elements, in which a gold dot electrode has been formed as an upper electrode on the high dielectric thin film thus produced and having a multilayer structure in which three layers, five layers, or ten layers of $Ca_2NaNb_4O_{13}$ have been laminated. The leak current density is a current density measured with a semiconductor parameter analyzer (Keithley's 4200-SCS) with an applied voltage of +1 V. On the other hand, for the relative dielectric constant, the electrostatic capacitance is measured with a high-precision LCR meter (Agilent Technologies' 4284A) at a frequency of 10 kHz, and the relative dielectric constant is calculated from the data.

TABLE 5

| Composition | Number of Laminated layers | Film Thickness | Leak Current Density | Relative Dielectric Constant |
|---|---|---|---|---|
| $Ca_2NaNb_4O_{13}$ | 3 Layers | 6 nm | $8 \times 10^{-8}$ A/cm$^2$ | 302 |
| $Ca_2NaNb_4O_{13}$ | 5 Layers | 10 nm | $1 \times 10^{-8}$ A/cm$^2$ | 300 |
| $Ca_2NaNb_4O_{13}$ | 10 Layers | 20 nm | $2 \times 10^{-8}$ A/cm$^2$ | 304 |

From Table 5, the leak current properties of the high dielectric thin films from the perovskite nanosheets all showed a satisfactory insulating property of $10^{-8}$ A/cm$^2$ or less though the film thickness was ultra-thin to be from 6 to 20 nm. The leak current when compared with an already-existing material with a film thickness of 10 nm shows extremely excellent insulating properties in which the leak current is suppressed by about 10,000 times over an already-existing perovskite-type oxide thin film $(Ba, Sr)TiO_3$. In addition, the relative dielectric constant of the perovskite nanosheet was as high as 300 or more irrespective of the number of the laminated layers. From the above, a high dielectric thin film realizing stable high dielectric properties and insulating properties at the same time could be produced though having a film thickness of nano-scale.

Example 2

In the present Example, a perovskite nanosheet $Ca_2NaNb_4O_{13}$ was produced starting from a layered perovskite oxide $KCa_2NaNb_4O_{13}$ and, as shown in FIG. 1, a high dielectric thin film made of the perovskite nanosheet (2) was produced as shown below on an atomic planar epitaxial $SrRuO_3$ substrate (1) serving as a lower electrode substrate by the alternate self-organization lamination technology.

By a method similar to that of Example 1, layered perovskite oxide $KKCa_2NaNb_4O_{13}$ was exfoliated to individual layers, and a milky white sol solution was produced in which rectangular nanosheets (2) having a compositional formula of $KCa_2NaNb_4O_{13}$ and having a thickness of about 2 nm and a lateral size about 10 μm were dispersed.

The surface of the conductive substrate (1) that will be a lower electrode made of an atomic planar epitaxial $SrRuO_3$ was washed by UV irradiation in an ozone atmosphere. Subsequently, this substrate was dipped in a solution of hydrochloric acid:methanol=1:1 for 20 minutes and then dipped in concentrated sulfuric acid for 20 minutes to perform a hydrophilization treatment.

This substrate (1) was subjected to a series of operations shown below with respect to the nanosheets (2) as one cycle, and this cycle was repeated for a needed number of times to produce a thin film having a desired film thickness. For example, the structure of FIG. 1 shows a result obtained by repeating this cycle for three times.

[1] Dipping in a PEI solution as the above polycation solution for 20 minutes.

[2] Fully washing with Milli-Q pure water.

[3] Dipping in one of the above nanosheet sol solutions with stirring.

[4] After 20 minutes, fully washing with Milli-Q pure water.

[5] With dipping in an aqueous TBAOH solution having a pH of 11, the obtained thin film is ultrasonically processed for 20 minutes in an ultrasonic washing tank (manufactured by Branson, 42 kHz, 90 W).

The thin film thus produced and having a superlattice structure was irradiated with UV rays from a xenon light source (1 mW/cm$^2$, 72 hours) to give a thin film from which the organic polymer had been decomposed and removed through optical catalytic reaction of the perovskite nanosheets.

Evaluation of the relative dielectric constant and the leak current density was carried out by a technique and measurement conditions similar to those of Example 1 on the high dielectric thin film thus produced and having a multilayer structure in which three layers, five layers, or ten layers of $Ca_2NaNb_4O_{13}$ had been laminated, whereby the same result as that of Table 5 was obtained. In other words, in the present Example 2, the effectiveness of the present invention has been verified by an element fabrication technique different from that of Example 1.

Example 3

In the present Example, a perovskite nanosheet ($Ca_2Na_2Nb_5O_{16}$) was produced starting from a layered perovskite oxide (for example, $KCa_2Na_2Nb_5O_{16}$) and, as shown in FIG. 1, a high dielectric thin film made of the perovskite nanosheet (2) was produced as shown below on an atomic planar epitaxial $SrRuO_3$ substrate (1) serving as a lower electrode substrate by the LB method.

The layered perovskite oxide $KCa_2Na_2Nb_5O_{16}$ was obtained by mixing $KCa_2NaNb_4O_{13}$ and $NaNbO_3$ in a ratio of 1:1 and sintering the obtained mixture at 1473K for 24 hours. Then, 5 g of the obtained powder was acid-treated in 200 cm$^3$ of 5 N nitric acid solution at room temperature to give a hydrogen-exchanged layered perovskite oxide $HCa_2Na_2Nb_5O_{16}\cdot1.5H_2O$, and thereafter 100 cm$^3$ of an aqueous solution of tetrabutylammonium hydroxide (hereinafter referred to as TBAOH) was added to 0.4 g of each of the hydrogen-exchanged layered perovskite oxide, and reacted with stirring at room temperature for 7 days to give a milky white sol solution in which rectangular nanosheets (2) having a compositional formula of $Ca_2Na_2Nb_5O_{16}$ and having a thickness of about 2.5 nm and a lateral size about 5 μm were dispersed.

The surface of the conductive substrate (1) that would be a lower electrode made of an atomic planar epitaxial $SrRuO_3$ was washed by UV irradiation in an ozone atmosphere.

In a 1-dm$^3$ volumetric flask, 8 cm$^3$ of each of the perovskite nanosheet sol solutions was dispersed in ultra pure water. This dispersion solution was left to stand for about half a day to one day, and then the dispersion solution was spread on an LB trough well washed with acetone, and kept as such for 30 minutes so that the liquid surface would be stabilized and the temperature of the lower layer liquid would reach constant. Thereafter, the above-prepared substrate (1) was set in an LB film formation apparatus and, with a series of operations shown below being carried out as one cycle on the perovskite nanosheets, this cycle was repeated to laminate the perovskite nanosheets, whereby a high dielectric thin film having a multilayer structure was provided.

[1] The barrier is moved at a compression speed of 0.5 mm/min to compress the surface, whereby one kind of the perovskite nanosheets dispersed on the vapor/water interface are collected and gathered, and after the system has reached a predetermined pressure, this is quietly left to stand for 30 minutes. In that manner, a monolayer film is formed in which the perovskite nanosheets are aligned in parallel and are integrated in the vapor/water interface.

[2] The substrate (1) is vertically drawn up at a drawing speed of 0.8 mm/min to adhere the monolayer film onto the substrate, whereby a thin film is produced in which the one kind of perovskite nanosheets are closely packed.

The thin film thus produced and having a multilayer structure was irradiated with UV rays from a xenon light source (1 mW/cm$^2$, 72 hours) to give a thin film from which the TBAOH used as an exfoliating agent had been decomposed and removed through optical catalytic reaction of the perovskite nanosheets.

Figure 3:
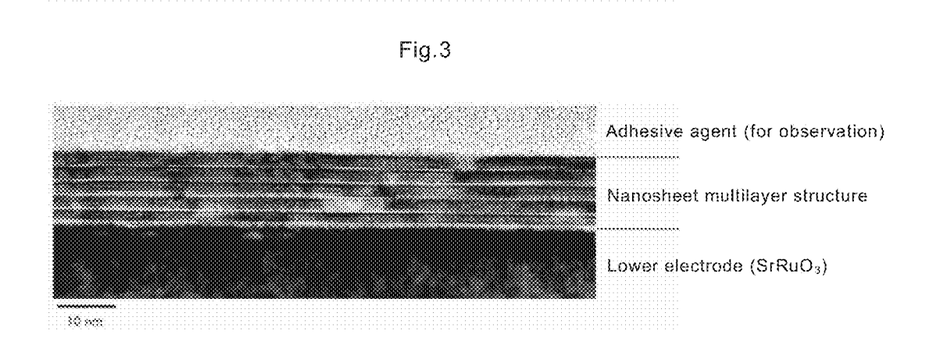
FIG. 3 is a view showing a result of evaluating the cross-section structure of the thin film by observation with a high-resolution transmission electron microscope on the thin film obtained by laminating five layers of perovskite nanosheets shown in Example 1.

FIG. 3 is a result of evaluating the cross-section structure of the thin film by observation with a high-resolution transmission electronic microscope on the multilayer structure in which five layers of $Ca_2Na_2Nb_5O_{16}$ thus produced are laminated. A multilayer structure in which nanosheets were accumulated in parallel on an atomic level on the substrate was confirmed, and it had a multilayer structure in which five layers each having a thickness of about 2.5 nm were laminated. By this, it could be confirmed that a high-quality film having a multilayer structure was realized in which the nanosheet monolayer films were alternately laminated while maintaining the closeness and smoothness of the nanosheet monolayer films.

The matter that should be further noted in FIG. 3 is that there was formed neither a low-dielectric layer nor an interface layer accompanying the substrate interface deterioration and the composition deviation caused by thermal annealing in the production sequence, which was problematic in already-existing ferroelectric high-dielectric thin films, between the substrate (1) serving as the lower electrode and the perovskite nanosheet thin film. This is a remarkable effect produced by the fact that the production sequence for the nanosheet thin film of the present Example uses a room-temperature solution process free from the influence of substrate interface deterioration and composition deviation.

Table 6 shows the data of the relative dielectric constant and the leak current density of the thin film elements, that is, the high dielectric elements, in which a gold dot electrode has been formed as an upper electrode on the high dielectric thin film thus produced and having a multilayer structure in which three layers, five layers, or ten layers of $Ca_2Na_2Nb_5O_{16}$ have been laminated. The leak current density is a current density measured with a semiconductor parameter analyzer (Keithley's 4200-SCS) with applied voltage of +1 V. On the other hand, for the relative dielectric constant, the electrostatic capacitance is measured with a high-precision LCR meter (Agilent Technologies' 4284A) at a frequency of 10 kHz, and the relative dielectric constant is calculated from the data.

TABLE 6

| Composition | Number of Laminated layers | Film Thickness | Leak Current Density | Relative Dielectric Constant |
|---|---|---|---|---|
| $Ca_2Na_2Nb_5O_{16}$ | 2 Layers | 5 nm | $8 \times 10^{-7}$ A/cm$^2$ | 387 |
| $Ca_2Na_2Nb_5O_{16}$ | 5 Layers | 12.5 nm | $2 \times 10^{-8}$ A/cm$^2$ | 385 |
| $Ca_2Na_2Nb_5O_{16}$ | 10 Layers | 25 nm | $2 \times 10^{-8}$ A/cm$^2$ | 390 |

From Table 6, the leak current properties of the high dielectric thin films from the perovskite nanosheets all exhibited insulating properties as satisfactory as $10^{-4}$ A/cm$^2$ or less in spite of the film thickness was ultra-thin to be from 5 to 25 nm. The leak current when compared with an already-existing material with a film thickness of 12 nm shows extremely excellent insulating properties in which the leak current is suppressed by about 1000 times over an already-existing perovskite-type oxide thin film $(Ba, Sr)TiO_3$. In addition, the relative dielectric constant of the perovskite nanosheet was as high as 300 or more irrespective of the number of the laminated layers. From the above, a high dielectric thin film realizing stable high dielectric properties and insulating properties at the same time could be produced though having a film thickness of nano-scale. In other words, in the present Example 3, the effectiveness of the present invention has been verified by a material different from that of Examples 1 and 2.

Example 4

In the present Example, a perovskite nanosheet $Ca_2NaNb_4O_{13}$, $Ca_2Na_2Nb_5O_{16}$ was produced starting from a layered perovskite oxide $KCa_2NaNb_4O_{13}$, $KCa_2Na_2Nb_5O_{16}$ and, as shown in FIG. 1, a high dielectric thin film made of the perovskite nanosheet (2) was produced as shown below on a Pt substrate (1) serving as a lower electrode substrate by the LB method.

The perovskite nanosheet $Ca_2NaNb_4O_{13}$, $Ca_2Na_2Nb_5O_{16}$ was produced by a method similar to that of the above Examples 1 to 3 and starting from the layered perovskite oxide $KCa_2NaNb_4O_{13}$, $KCa_2Na_2Nb_5O_{16}$.

The surface of the Pt substrate (1) that would be used as a lower electrode was washed by UV irradiation in an ozone atmosphere.

In a 1-dm$^3$ volumetric flask, 8 cm$^3$ of the perovskite nanosheet sol solution was dispersed in ultra pure water. This dispersion solution was left to stand for about half a day to one day, and then the dispersion solution was spread on an LB trough well washed with acetone, and kept as such for 30 minutes so that the liquid surface would be stabilized and the temperature of the lower layer liquid would reach constant. Thereafter, the above-prepared substrate (1) was set in an LB film formation apparatus and, with a series of operations shown below being carried out as one cycle, the perovskite nanosheets were laminated, whereby a multilayer structure preferable for a high dielectric thin film was produced.

[1] The barrier is moved at a compression speed of 0.5 mm/min to compress the surface, whereby the perovskite nanosheets dispersed on the vapor/water interface are collected and gathered, and after the system has reached a predetermined pressure, this is quietly left to stand for 30 minutes. In that manner, a monolayer film is formed in which the perovskite nanosheets are aligned in parallel and are integrated in the vapor/water interface.

[2] The substrate (1) is vertically drawn up at a drawing speed of 0.8 mm/min to adhere the monolayer film onto the substrate, whereby a thin film is produced in which the perovskite nanosheets are closely packed.

The thin film thus produced and having a multilayer structure was irradiated with UV rays from a xenon light source (1 mW/cm$^2$, 72 hours) to give a thin film from which the TBAOH used as an exfoliating agent had been decomposed and removed through optical catalytic reaction of the perovskite nanosheets.

Table 7 shows the data of the relative dielectric constant and the leak current density of the five-layer lamination film of $Ca_2NaNb_4O_{13}$, $Ca_2Na_2Nb_5O_{16}$ thus produced. Evaluation of the relative dielectric constant and the leak current density was carried out by a technique and measurement conditions similar to those of Examples 1 to 3, whereby a result equivalent to that of Table 5 was obtained for $Ca_2NaNb_4O_{13}$, and a result equivalent to that of Table 6 was obtained for $Ca_2Na_2Nb_5O_{16}$. In other words, in the present Example 4, the effectiveness of the present invention has been verified by an element structure different from that of Examples 1 to 3.

TABLE 7

| Composition | Number of Laminated layers | Film Thickness | Leak Current Density | Relative Dielectric Constant |
|---|---|---|---|---|
| $Ca_2Na_2Nb_4O_{13}$ | 5 Layers | 10 nm | $6 \times 10^{-8}$ A/cm$^2$ | 297 |
| $Ca_2Na_2Nb_5O_{16}$ | 5 Layers | 12.5 nm | $1 \times 10^{-8}$ A/cm$^2$ | 380 |

Figure 4:
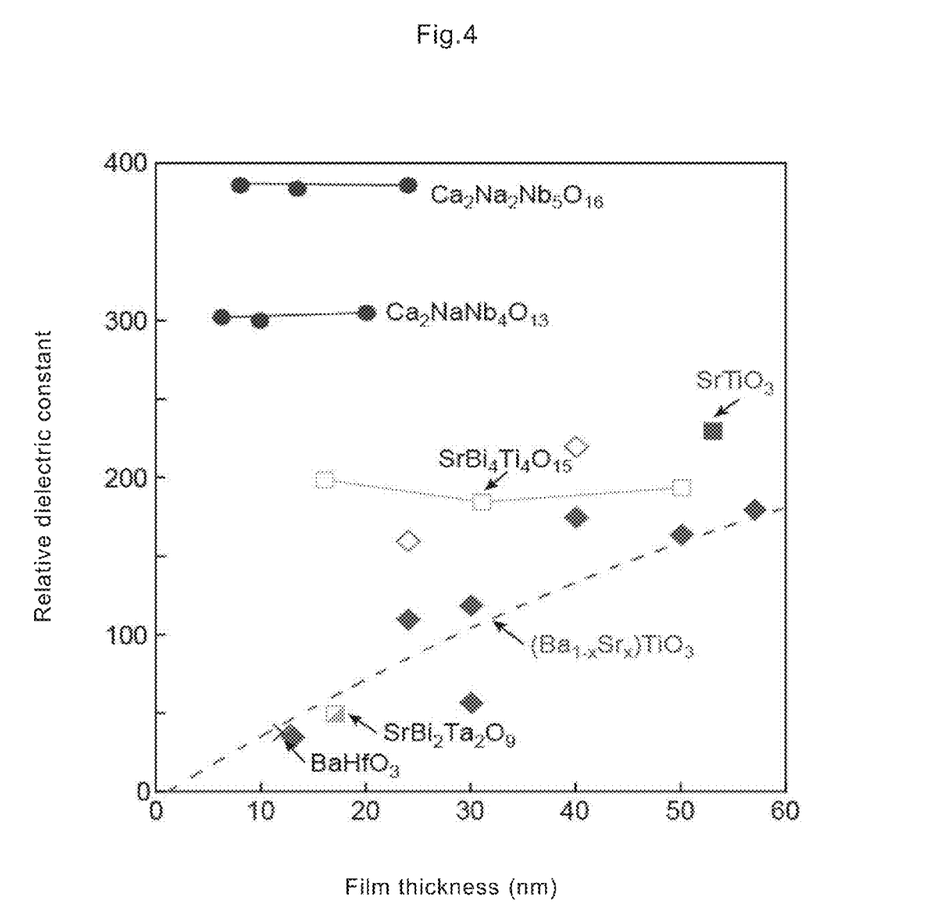
FIG. 4 is a view comparing the film thickness dependency of the relative dielectric constant between the perovskite nanosheet thin films shown in Examples 1 to 4 and typical high dielectric oxide materials.

FIG. 4 shows plotted data of the film thickness dependency of the relative dielectric constant of the high dielectric thin films made of $Ca_2NaNb_4O_{13}$ and $Ca_2Na_2Nb_5O_{16}$ shown in Examples 1 to 4. In addition, this shows, for comparison, the film thickness dependency of the relative dielectric constant of typical high dielectric oxide materials. When an already-existing perovskite-type oxide, for example, $(Ba, Sr)TiO_3$ is thinned to a nano-level for the purpose of attaining increased capacitance, then the relative dielectric constant thereof lowers; but contrary to this, the perovskite nanosheet thin films of the present invention are free from any remarkable size effect, and kept a high relative dielectric constant of at least 200 even when they had a thickness of about 5 to 10 nm. The matter to be specifically noted is that the perovskite nanosheet thin films of the present invention have a greatly larger relative dielectric constant far over already-existing high dielectric oxide materials in the thin film region of 10 nm level. Accordingly, the present invention has an epoch-making effect of bringing about size-free high dielectric properties capable of realizing both a high dielectric constant and a satisfactory insulating property at the same time even in a nano-scale region.

As shown above in Examples 1 to 4, the perovskite nanosheet thin films of the present invention have a greatly larger relative dielectric constant far over any other already-existing high dielectric oxide materials in the thin film region where the film thickness is 50 nm or less. By utilizing the above properties, there can be provided a high dielectric thin film realizing both a scale reduction of $1/20$ and an increase in the capacitance by 10 times or more as compared with a conventional barium titanate type thin film.

Here, in forming a multilayer film of the high dielectric thin film, adhesion of the perovskite nanosheet thin film also to the upper electrode substrate by the technique of Examples 1 to 4 described above to form multiple layers on both of the substrates in combination is also comprised within the scope of the present invention.

When the high dielectric thin film obtained in the above-described manner is applied to capacitors and others, then it is possible to obtain an element having a larger capacitance by 10 times or more as compared with already-existing high dielectric oxide materials having the same film thickness. Further, the present invention has other excellent effects in that the leak current can be suppressed and electric current consumption can be reduced and that, in increased integration of capacitors, various types of devices can be designed in any desired manner.

The embodiments in the above are for describing the present invention with reference to an example of forming a multilayer structure of perovskite nanosheets on an atomic planar epitaxial $SrRuO_3$ substrate or on Pt and applying it to a high dielectric thin film and a high dielectric element; however, the high dielectric element according to the present invention can be used as a thin-film capacitor by itself, and can also be used for multilayer capacitors, high-frequency devices, DRAM memories, gate insulators for transistors and others, exhibiting the same excellent effects.

As described above, the present invention can realize both a high dielectric constant and good insulating properties at the same time even in a nano-region by making good use of the inherent nano-physical properties and high-level texture and structure controllability of perovskite nanosheets.

With perovskite nanosheets, an element can be produced by using soft chemical reaction such as self-organization at room temperature, so that the problems such as substrate interface deterioration and composition deviation caused by thermal annealing in a conventional production sequence can be evaded, and also hybridization with various materials can be made. In particular, the heat resistance temperature of conventional epoxy-type resin substrates was as low as about 300° C., and it was not possible to mount a capacitor; however, by using the perovskite nanosheets of the present invention, forming of a high dielectric thin film and mounting of a capacitor can be carried out.

In addition, the present invention has realized a low-cost, low-environmental risk process, which are not requiring any large-scale vacuum apparatus or expensive film formation apparatus that have been the mainstream of conventional dielectric thin film processes. Therefore, it is concluded that, when a high dielectric nano-material of the present invention is applied to the technical field of electronic materials such as multilayer capacitors and high-frequency devices, the IT technology field, or the nano-electronics in which backbone components are made of high dielectric materials, it would be extremely useful.

As described in detail, it is possible to make good use of the inherent high dielectric properties and high-level structure controllability of perovskite-structured oxide, whereby high dielectric properties can be realized.

Further, it is possible to make good use of the inherent high dielectric properties and excellent insulating properties of a layered perovskite structure in which at least four $NbO_6$ octahedrons, $TaO_6$ octahedrons or $TiO_6$ octahedrons are included in a unit lattice, whereby both high dielectric properties and excellent insulating properties can be realized at the same time.

Further, by using an extremely thin nanosheet-form oxide having a thickness of about 1 nm, production and designing of a high dielectric thin film at a nano-level can be made.

Further, it is possible to extract single substance nanosheets from a perovskite oxide including, as a basic block, a $NbO_6$ octahedron, a $TaO_6$ octahedron or a $TiO_6$ octahedron known as a high dielectric material, and artificial reconstruction can be carried out.

Further, production and designing of a high dielectric thin film having a higher dielectric constant than conventional perovskite can be made in a nano-level thin film in which a nanosheet-form perovskite oxide including a $NbO_6$ octahedron, a $TaO_6$ octahedron or a $TiO_6$ octahedron can be extracted as a single substance.

Also, it is made possible to provide a high dielectric thin film capable of functioning even though it has a nano-scale thickness of 100 nm or less, and therefore it is possible to achieve both thickness reduction and capacitance increase that could not be attained at all with conventional high dielectric thin films.

Further, even poorly self-sustainable nanosheet-form perovskite oxide can be held on an electrode substrate and therefore can be readily handled, and accordingly, the productivity of the elements using a high dielectric thin film can be ensured.

Further, there is provided a capacitor-structured element using the above-described high dielectric thin film, and the productivity and stability of the high dielectric elements can be ensured.

Further, by using the Langmuir-Blodgett process, it is made possible to produce a high-quality high dielectric thin film in which the surface of the substrate is covered with nanosheet-form perovskite oxide closely and with no gap, whereby a high-performance high dielectric element with no or few defects to cause leak current in circuits can be directly produced through a low-cost and room-temperature solution process.

Also, unlike a conventional high dielectric thin film process, a solution process at room temperature not requiring annealing or the like at a high temperature can be carried out, so that a high-performance high dielectric element can be provided by evading the problems such as substrate interface deterioration and composition deviation caused in a conventional element production sequence.

Further, a low-cost room-temperature solution process using a beaker and forceps can be carried out, so that it is possible to realize a low-cost, low-environmental risk process, which are not requiring any large-scale vacuum apparatus or expensive film formation apparatus that have been the mainstream of conventional high dielectric thin film processes.

Further, it is made possible to produce a high-quality high dielectric thin film in which the surface of the substrate is covered with nanosheet-form perovskite oxide closely and with no gap, whereby a high-performance high dielectric element with no or few defects to cause leak current in circuits can be provided.

Further, it is made possible to produce an inorganic high dielectric element from which organic substances have been removed, so that a high-performance high dielectric element can be provided by sweeping out the problems such as substrate interface deterioration and composition deviation accompanying the thermal treatment step of conventional element production sequences.

Further, it is made possible to produce an inorganic high dielectric element from which organic substances is removed stably and conveniently by low-temperature heating, so that a high-performance high dielectric element can be provided by sweeping out the problems such as substrate interface deterioration and composition deviation accompanying the thermal treatment step of conventional element production sequences.

INDUSTRIAL APPLICABILITY

High dielectric thin films are utilized in all electronic instruments such as multilayer capacitors, high-frequency devices, DRAM memories, gate insulators for transistors and others, and global industry-government-academia collaboration for studies and developments is under fierce competition, aiming at practical use thereof. The economic advantages of the nano-materials developed this time are obvious, taking the above points and the following into consideration: (1) the nano-materials can function with the smallest film thickness among the conventional materials and can realize both a high dielectric constant and good insulating properties at the same time; (2) the element can be produced through a room-temperature and low-cost solution process; (3) all the problems accompanying the conventional thermal annealing have been swept out because the room-temperature process has been realized; (4) forming of a high dielectric thin film and mounting of a capacitor can be carried out on a resin substrate or the like on which it was conventionally difficult to mount; the present invention has realized a low-cost low-environmental risk process not requiring any large-scale vacuum apparatus and expensive film formation apparatus that are the mainstream of conventional dielectric thin film processes.

The invention claimed is:

1. A high dielectric nanosheet laminate produced by laminating nanosheets each of which has a thickness of 10 nm or less and is formed of an oxide that has a perovskite structure wherein at least four $NbO_6$ octahedrons, $TaO_6$ octahedrons or $TiO_6$ octahedrons are included in a unit lattice.

2. The high dielectric nanosheet laminate according to claim 1, wherein each of the nanosheets has a lateral size of 10 nm to 1000 μm.

3. The high dielectric nanosheet laminate according to claim 1, wherein the nanosheets is one produced by exfoliating any of the layered oxides represented by the following formula or a hydrate thereof:
formula $A[Ca_2Na_{n-3}Nb_nO_{3n+1-d}]$, $A[(Ca_{1-x}Sr_x)_2Na_{n-3}Nb_nO_{3n+1-d}]$, or $A[M_{n-1}A'_{n-3}M'_nO_{3n+1-d}]$ (A, A' are at least one selected from H, Li, Na, K, Rb and Cs; M is at least one selected from Sr, Ba, Pb, Bi, or rare earth elements La, Ce, Pr, Sm, Eu, Gd, Tb, Dy, Ho, Er, Tm, Yb and Lu; M' is at least one selected from Ti, Mg, Mn, Zn, Nb and Ta; x=0 to 1; n=3 to 8; and d=0 to 2).

4. The high dielectric nanosheet laminate according to claim 1, wherein the nanosheets is a perovskite oxide represented by the following compositional formula:
formula $[Ca_2Na_{n-3}Nb_nO_{3n+1-c}]$, $[(Ca_{1-x}Sr_x)_2Na_{n-3}Nb_nO_{3n+1-d}]$, or $[M_{n-1}A'_{n-3}M'_nO_{3n+1-d}]$ (A' is at least one selected from H, Li, Na, K, Rb and Cs; M is at least one selected from Sr, Ba, Pb, Bi, or rare earth elements La, Ce, Pr, Sm, Eu, Gd, Tb, Dy, Ho, Er, Tm, Yb and Lu; M' is at least one selected from Ti, Mg, Mn, Zn, Nb and Ta; x=0 to 1; n=3 to 8; and d=0 to 2).

5. The high dielectric nanosheet laminate according to claim 1, which has a thickness of 1 nm to 100 nm.

6. A high dielectric element produced by adhering a high dielectric nanosheet laminate according to claim 1 onto an electrode substrate.

7. A high dielectric element wherein a high dielectric nanosheet laminate according to claim 1 is disposed between a first electrode substrate and a second electrode substrate.

8. A method for producing a high dielectric element wherein a high dielectric nanosheet laminate according to claim 1 is disposed between a first electrode substrate and a second electrode substrate, wherein the high dielectric nanosheet laminate according to claim 1 is adhered onto at least one electrode substrate of the first and second electrode substrates, and the first and second electrode substrates are so disposed that the high dielectric nanosheet laminate is located therebetween.

9. The method for producing a high dielectric element according to claim 8 in which the high dielectric nanosheet laminate is produced by repeating a step of forming a monolayer film in which a surface of a substrate is covered with the oxide closely and with no gap by the Langmuir-Blodgett process, and then adhering the monolayer film onto the electrode substrate.

10. The method for producing a high dielectric element according to claim 8 in which the high dielectric nanosheet laminate is produced by dipping the electrode substrate into a cationic organic polymer solution to allow an organic polymer to be adsorbed onto a substrate surface thereof, and then dipping the electrode substrate into a colloid solution in which the nanosheets are suspended, so as to allow the nanosheets to be adsorbed onto the polymer by electrostatic interaction.

11. The method for producing a high dielectric element according to claim 10, wherein the overlapping parts of the nanosheets are removed by applying ultrasonic waves thereto in the step of allowing the nanosheets to be adsorbed onto the electrode substrate by electrostatic interaction.

12. The method for producing a high dielectric element according to claim 10, wherein the organic polymer is removed through irradiation with UV rays after the high dielectric nanosheet laminate is produced.

13. The method for producing a high dielectric element according to claim 10, wherein the organic polymer is removed by heating after the high dielectric nanosheet laminate is produced.

* * * * *